(12) United States Patent
Hawker et al.

(10) Patent No.: US 8,187,770 B2
(45) Date of Patent: May 29, 2012

(54) HIGH PERFORMANCE, CROSSLINKED POLYMERIC MATERIAL FOR HOLOGRAPHIC DATA STORAGE

(75) Inventors: Craig J. Hawker, Santa Barbara, CA (US); Galen D. Stucky, Santa Barbara, CA (US); Alexander Mikhailovsky, Ventura, CA (US); Anzar Khan, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 617 days.

(21) Appl. No.: 12/284,537

(22) Filed: Sep. 23, 2008

(65) Prior Publication Data

US 2009/0104561 A1 Apr. 23, 2009

Related U.S. Application Data

(60) Provisional application No. 60/999,812, filed on Oct. 19, 2007.

(51) Int. Cl.
*G03H 1/02* (2006.01)

(52) U.S. Cl. .......... 430/1; 430/2; 430/281.1; 430/280.1; 359/3

(58) Field of Classification Search .................. None
See application file for complete search history.

(56) References Cited

U.S. PATENT DOCUMENTS

| | | | | |
|---|---|---|---|---|
| 4,413,052 A | * | 11/1983 | Green et al. | 430/327 |
| 4,632,968 A | * | 12/1986 | Yokota et al. | 526/279 |
| 5,545,676 A | * | 8/1996 | Palazzotto et al. | 522/15 |
| 6,569,600 B2 | * | 5/2003 | Dinnocenzo et al. | 430/270.15 |
| 6,969,578 B2 | * | 11/2005 | Robello et al. | 430/270.14 |
| 7,022,392 B2 | * | 4/2006 | Dinnocenzo et al. | 428/64.1 |
| 2002/0156142 A1 | * | 10/2002 | Mikhael et al. | 522/15 |
| 2003/0072250 A1 | | 4/2003 | Dinnocenzo et al. | |
| 2004/0027625 A1 | * | 2/2004 | Trentler et al. | 359/3 |
| 2005/0095390 A1 | | 5/2005 | Dinnocenzo et al. | |
| 2005/0136357 A1 | * | 6/2005 | Farid et al. | 430/270.11 |

FOREIGN PATENT DOCUMENTS

JP 2006-070164 * 3/2006

OTHER PUBLICATIONS

Asouti et al. "regioselective and diastereoselective dimehyldioxane epoxidation of substituted norborenes and hexamethyl Dewar benzene", Tetrahed. Lett., vol. 41, pp. 539-542 (2000).*

(Continued)

*Primary Examiner* — Martin Angebranndt
(74) *Attorney, Agent, or Firm* — Berliner & Associates

(57) ABSTRACT

An optical recording material and methods of making such material is provided. The material comprises of a dewar benzene monomer, with at least two cross-linkable groups, a sensitizer, a cross-linker, and an initiator. The material does not require a binder or a co-sensitizer. The material can be fabricated by an exceedingly easy technique that offers high photosensitivity, high diffraction efficiency, millimeter thickness, and high dynamic range.

23 Claims, 4 Drawing Sheets

OTHER PUBLICATIONS

Evans, T. R., Wake, R. W. & Sifain, M. M. Singlet Quenching Mechanisms III (1). Sensitized Isomerization of Hexamethylbicyclo [2.2.0] Hexa-2, 5-Diene. A Chain Reaction. Tett lett. 9, 701-704 (1973).

Merkel, P. B., Roh, Y., Dinnocenzo, P. J., Robello, D. R. & Farid. S. Highly Efficient Triplet Chain Isomerization of Dewar Benzenes: Adiabatic Rate Constants from Cage Kinetics. J. Phys. Chem. A. 111, 1188-199 (2007).

Gillmore, J. G. et al. Quantum Amplified Isomerization: A New Concept for Polymeric Optical Materials. Macromolecules. 38, 7684-7694 (2005).

Robello, D. R., Farid. S. Y., Dinnocenzo, P. J. & Brown, T. G. Refractive index imaging via a chemically amplified process in a solid polymeric medium. Proc. of SPIE. 61117, 611170F1-611170F8 (2006).

* cited by examiner

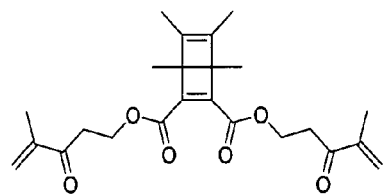

bis(4-methyl-3-oxopent-4-enyl) 1,4,5,6-tetramethylbicyclo[2.2.0]hexa-2,5-diene-2,3-dicarboxylate

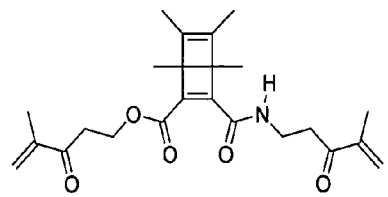

4-methyl-3-oxopent-4-enyl 1,4,5,6-tetramethyl-3-(4-methyl-3-oxopent-4-enylcarbamoyl)bicyclo[2.2.0]hexa-2,5-diene-2-carboxylate

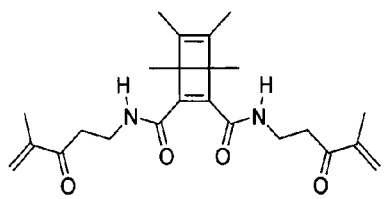

1,4,5,6-tetramethyl-$N^2,N^3$-bis(4-methyl-3-oxopent-4-enyl)bicyclo[2.2.0]hexa-2,5-diene-2,3-dicarboxamide

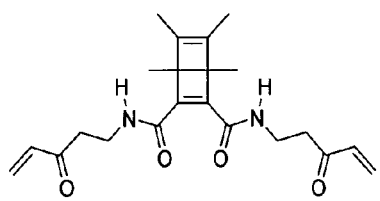

1,4,5,6-tetramethyl-$N^2,N^3$-bis(3-oxopent-4-enyl)bicyclo[2.2.0]hexa-2,5-diene-2,3-dicarboxamide

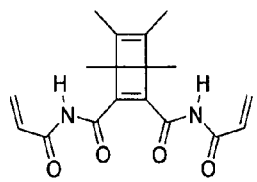

$N^2,N^3$-diacryloyl-1,4,5,6-tetramethylbicyclo[2.2.0]hexa-2,5-diene-2,3-dicarboxamide

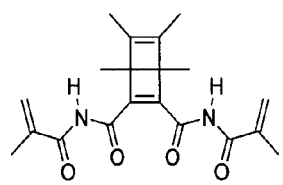

$N^2,N^3$-dimethacryloyl-1,4,5,6-tetramethylbicyclo[2.2.0]hexa-2,5-diene-2,3-dicarboxamide

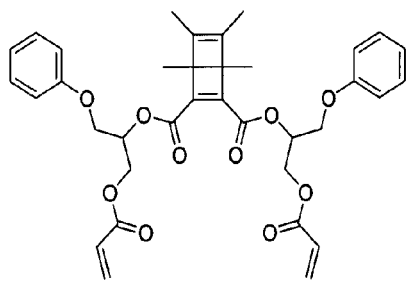

bis(1-(acryloyloxy)-3-phenoxypropan-2-yl) 1,4,5,6-tetramethylbicyclo[2.2.0]hexa-2,5-diene-2,3-dicarboxylate

FIG. 4

HIGH PERFORMANCE, CROSSLINKED POLYMERIC MATERIAL FOR HOLOGRAPHIC DATA STORAGE

CROSS-REFERENCE TO RELATED APPLICATIONS

This application claims the benefit of U.S. Provisional Patent Application Ser. No. 60/999,812, filed Oct. 19, 2007 which is incorporated in its entirety.

FIELD OF THE INVENTION

The invention relates to compositions and methods for producing holographic optical recording material, and more particularly to those utilizing isomerized dewar benzene monomers.

BACKGROUND OF THE INVENTION

Research into development of new data storage devices is fueled by the continuing demand for ultra-high information capacity, more data density, and faster readout rates. Conventional data storage techniques rely on storing information bit by bit on the surface of the recording medium. The two-dimensional storage techniques, however, are rapidly reaching their fundamental physical limits beyond which individual bits may be too small to easily inscribe or read. A promising alternative approach is holographic data storage, in which information is stored throughout the volume of the storage medium. The key challenge in the field of holographic data storage is the development of a suitable storage material that meets all the stringent requirements.

Despite intensive research effort, suitable and commercially viable holographic material still remains illusive. In holographic data storage, a complete page of information is recorded as an optical interference pattern created by two intersecting laser beams within a thick photosensitive material. The interference pattern of these two coherent writing beams induces a periodic change in the refractive index of recording material. Though there are a number of photochemical reactions that can be utilized to achieve the refractive index modulation, very few exhibit quantum yields greater than unity. Nonlinearity of the photochemical reaction is essential to the required high sensitivity and hence ultrafast recording speed of the storage media. Photopolymerization is such a nonlinear reaction and hence utilized in fabrication of leading holographic media. However, a number of issues limit the performance and commercial viability of photopolymers. Major issues include shrinkage of the material due to formation of new bonds and diffusion of the monomers, polymerization inhibition due to oxygen and other inhibitor included in formulations to impart long shelf life to the media, induction period and need of pre-exposure due to inhibitors, dynamic range reduction due to pre-exposure, low shelf/archival life and several others. Hence, there is significant unmet need for a high performance holographic media.

Photoinduced isomerization of Dewar benzene has been found to occur in a chain reaction leading to isomerization quantum yields greater than 100 in solution and 1.2-20 in solid state. Moreover, light induced isomerization of dewar benzene is associated with a large change in the geometry and the electronic structure of the molecule and anticipated to result in a high refractive index modulation as a result of photoisomerization. These two properties; a) nonlinearity of photochemical reaction, and b) expected high index modulation, represent an opportunity to develop an information storage material with high recording speed and high capacity. Additionally, the non-diffusive writing process ensure no/insignificant dimensional changes of the media, good thermal stability of dewar benzene reactant guarantee high shelf life, and irreversible isomerization will circumvent fading of the holograms over a long period of time as seen in case of photorefractive polymers, resulting in high archival life of the holographic media. However, so far, materials based on dewar benzene isomerization have failed to exhibit high photosensitivities, easy fabrication process, and high diffraction efficiencies required for holographic data storage (1, 2, 3, 4, 5, 6). To this end, we synthesized various dewar benzene based monomers with varying electronic properties and subsequently investigated information storage properties of the material. Through a systematic study, we found that recording media containing electron deficient dewar benzene monomer co-crosslinked with a traditional crosslinker such as divinyl benzene exhibit excellent storage properties, in the absence of a binder or polymeric matrix, and in the absence of a co-sensitizer.

BRIEF SUMMARY OF THE INVENTION

In accordance with the invention, we provide a new class of material, fabricated by an exceedingly easy technique that offers high photosensitivity, high diffraction efficiency, millimeter thickness, and high dynamic range. High quality optical films fabricated from this new material exhibit virtually no scattering and low absorption cross-section at recording wavelength. The material is lightweight, inexpensive, and easily be processed in different shapes and forms, thus making it an attractive candidate for write-once-read-many (WORM) disk-based holographic memory. This can be accomplished in the absence of a binder/polymeric matrix, and in the absence of a co-sensitizer.

In one embodiment, an optical recording material is provided that is comprised of a dewar benzene monomer, with at least two cross-linkable groups, capable of undergoing isomerization thereby causing a change in optical properties; a sensitizer, capable of transferring electrons to said dewar-benzene reactant; and a cross-linker, capable of cross-linking said dewarbenzene reactant. In a preferred embodiment, an initiator is also included.

In one embodiment, an optical recording material is provided that does not require a binder or a co-sensitizer.

In another embodiment, a recoding device is provided that is comprised of a dewar benzene monomer, with at least two cross-linkable groups, capable of undergoing isomerization thereby causing a change in optical properties; a sensitizer, capable of transferring electrons to said dewar benzene reactant; a cross-linker, capable of cross-linking said dewar benzene reactant, and an initiator.

In another embodiment, a method of fabricating an optical film is provided that is comprised of mixing a dewar benzene monomer with a sensitizer, and a crosslinker, and curing of said reactant and crosslinker by assisted free radical polymerization. In a more particular embodiment, the curing process is carried out at about 80-100° C. for about 35-45 minutes. In yet another embodiment, the time taken for fabrication of the film is about 35-45 minutes.

BRIEF DESCRIPTION OF THE DRAWINGS

For a more complete understanding of the present invention, reference is now made to the following descriptions taken in conjunction with the accompanying drawings, in which:

FIG. 2A shows growth in first-order diffraction efficiency of a hologram recorded in 0.5 mm thick film as a function of exposure time. FIG. 2B shows diffraction efficiency of hologram as a function of rotation angle. Inset shows the well defined fringes accompanying the hologram.

FIG. 4 shows chemical structures of various photoactive dewar benzene monomers that can be utilized for holographic recording.

DETAILED DESCRIPTION OF THE INVENTION

Figure 1:
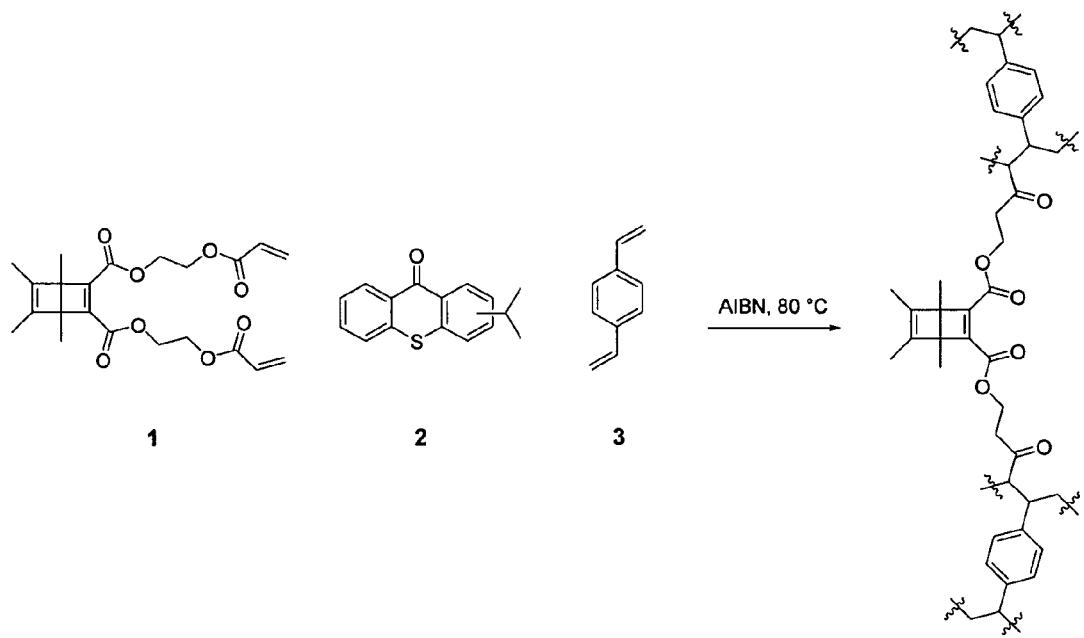
FIG. 1 shows chemical structures of different holographic media components and fabrication of thick film (0.5 mm) from these components by free radical polymerization reaction.

FIG. 1 shows different components of the holographic media material, a dewar benzene monomer 1 (bis(2-(acryloyloxy)ethyl) 1,4,5,6-tetramethylbicyclo[2.2.0]hexa-2,5-diene-2,3-dicarboxylate), a sensitizer 2 (Isopropyl-9H-thioxathen-9-one), a cross-linker 3 (divinylbenzene), and AIBN (Azobisisobutyronitrile) 4.

Preferably, the dewar benzene monomer has two or more cross-linking sites and can be of the formula:

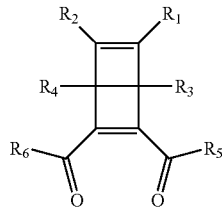

where R1, R2, R3, and R4 can be substituted or unsubstituted alkyl, alkoxy or phenyl groups, while R5 and R6 should preferably be a crosslinkable group such as an acrylate, methacrylate, vinyl benzene, vinyl ether, N-vinyl, alkyl thiol or alkoxy thiol groups.

Examples of other dewar benzene monomers that can be used are, but not limited to those shown in FIG. 4

As illustrative of the general synthesis procedure, bis(2-(acryloyloxy)ethyl) 1,4,5,6-tetramethylbicyclo[2.2.0]hexa-2,5-diene-2,3-dicarboxylate can be synthesized by a three step procedure with overall yield of 72%, as shown below:

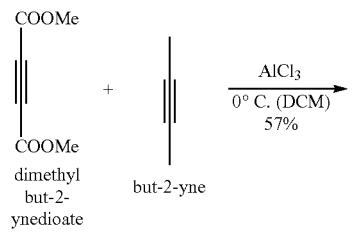

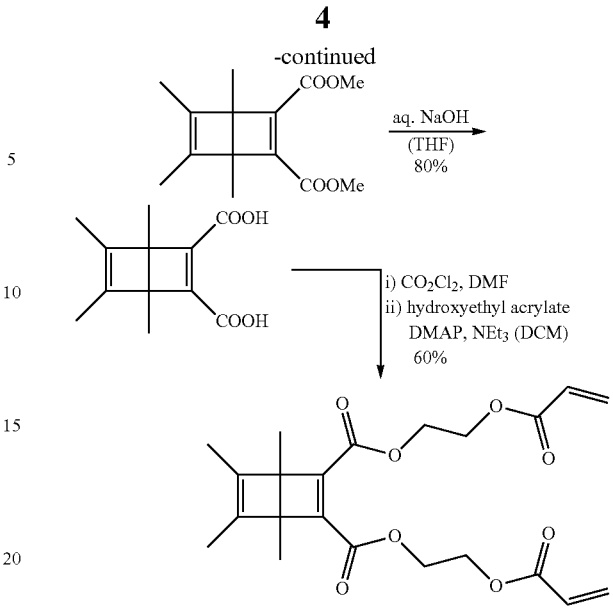

In one embodiment, isopropyl-9H-thioxanthen-9-one 2, a thioxanthene sensitizer, was chosen as sensitizer due to several advantageous features. Sensitizer 2 is highly soluble in the matrix material which allows fabrication of thick films by solvent less processing. The sensitizer exhibit low absorption cross-section at recording wavelength, which ensure homogeneous recording throughout the depth of the recording media. Most importantly, efficient energy transfer is expected from the sensitizer 2 to the dewar benzene reactant due to higher triplet energy of the sensitizer.

Other thioxanthene sensitizers that can be used are, but not limited to: thioxanthone; 2-(Trifluoromethyl)-9H-thioxanthen-9-one; 2-Isopropylthioxanthone; 2-Methylthiaxanthone; 3-Methoxy-4-(dimethylaminomethyl)thioxanthone hydrochloride; 3-Methoxy-4-(diethylaminomethyl)thioxanthone hydrochloride; 3-Methoxy-4-piperidinomethylthioxanthone hydrochloride; 3-Methoxy-4-morpholinomethylthioxanthone hydrochloride; 3-Hydroxy-4-(dimethylaminomethyl)-9-thioxanthenone hydrochloride; hydrochloride; 3-Hydroxy-4-piperidinomethyl-9-thioxanthenone hydrochloride; 2-(2-(Dimethylamino)ethoxy)thioxanthen-9-one hydrochloride; 2-(3-Dimethylaminopropoxy)thioxanthone hydrochloride monohydrate; 2-(2-(Diethylamino)ethoxy)thioxanthen-9-one hydrochloride; 4-(beta-Diethylaminoethylamino)-1,2-cyclohexenothiaxanthone; 3-Carboxythioxanthone-10,10-dioxide; 7-Methylthioxanthone-2-carboxylic acid; 4-(Bis(2'-chloroethyl)amino) propylamino-1,2-cyclohexenothioxanthone; 4-Isopropyl-9-thioxanthone; 4-(3-(Methylamino)propoxy)-9H-thioxanthen-9-one hydrochloride; 4-(4-(Methylamino) butoxy)-9H-thioxanthen-9-one hydrochloride.

In one embodiment, divinylbenzene is used as the cross-linker 3. However, diacrylates such as, but not limited to, can also be used as a cross-linker: 1,3-Butanediol diacrylate; 1,4-Butanediol diacrylate; 1,6-Hexanediol diacrylate; Ethylene glycol diacrylate; Glycerol 1,3-diglycerolate diacrylate; Pentaerythritol diacrylate monostearate; 1,6-Hexanediol ethoxylate diacrylate; 1,6-Hexanediol propoxylate diacrylate; Bisphenol A ethoxylate diacrylate; Bisphenol A propoxylate diacrylate; Di(ethylene glycol) diacrylate; Poly(ethylene glycol) diacrylate; Poly(propylene glycol) diacrylate; and Tetra(ethylene glycol) diacrylate.

In one preferred embodiment, thermal initiator such as AIBN is used. Other thermal initiators such as Azobis(cyclohexanecarbonitrile) and benzoyl peroxide can also be used.

Volume holography necessitates use of thick films ($\geq 200$ µm), though fabrication of such thick films with good optical qualities such as low scattering and low optical density is not trivial. Moreover, a rapid film fabrication method is desired to shorten the processing period and to increase the throughput. High optical quality films with variable thicknesses of up to 1 mm were fabricated by simply mixing and thermal curing of monomer 1 and divinylbenzene crosslinker 3 by AIBN 4 assisted free radical polymerization. The curing process was carried out at 95° C. for 25 minutes. This extremely simple, and fast processing technique provided transparent and colorless films with optical density of 0.42 (0.5 mm) at recording wavelength (FIG. 1). Moreover, such a reaction occurs in the absence of solvents. Scattering measurements revealed almost no light scattering by the films, indicating very high optical quality of the recording media. Please note that a low level of light scattering minimizes the noise in the recorded images.

Figures 2A, 2B:
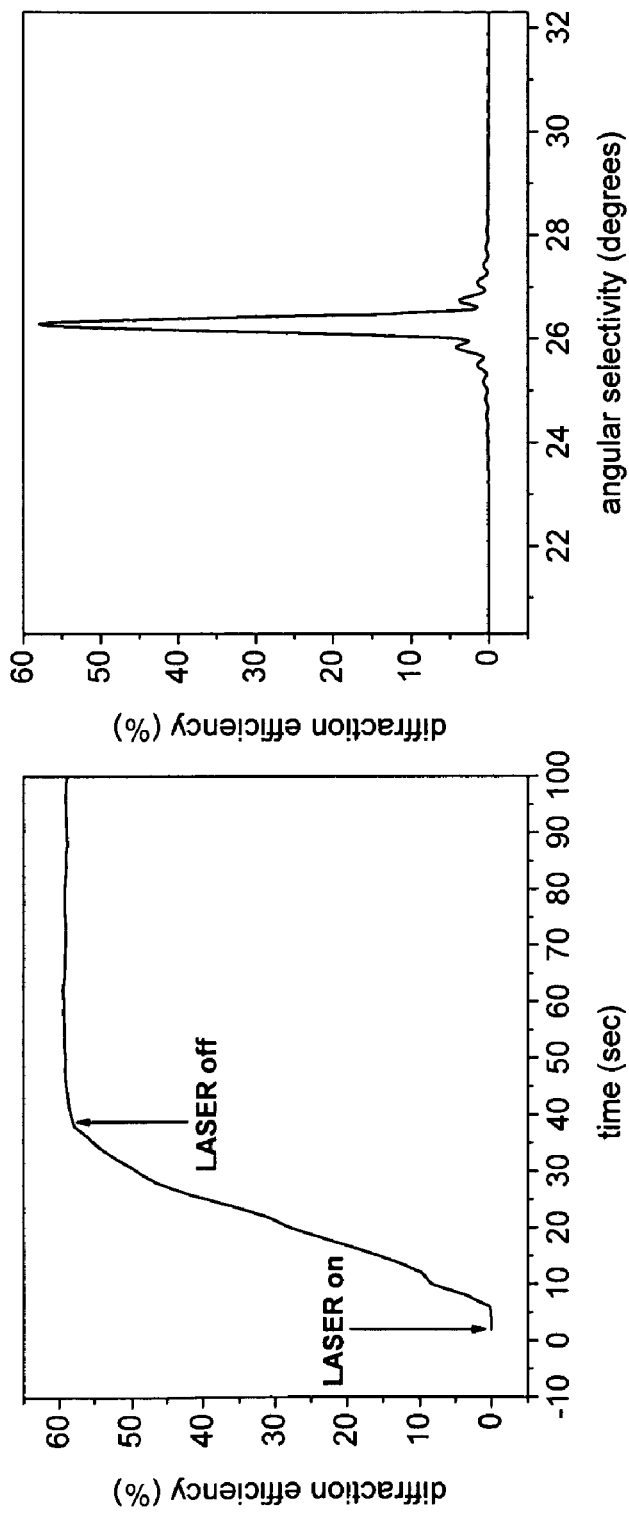
FIGS. 2A and 2B show real time diffraction efficiency and angular selectivity response of a plane-wave single hologram.

A single hologram was recorded by illuminating the sample with the interference pattern of two collimated 407 nm laser beam with optical power density of ~3 mW/cm2 in each arm and a beam diameter of ~10 mm. A low power (<1 mW) He—Ne laser emitting at 632.8 nm was used for readout. This readout beam was aligned onto the sample at Bragg's angle to observe the maximum diffraction efficiency. FIG. 2 (left) shows the growth in diffraction efficiency of the hologram as a function of exposure time. Merely 40 seconds of exposure was enough to exhaust the total storage capacity of the material. This very short recording time signify the high sensitivity of the recording material. The diffraction efficiency of the hologram was monitored over long period of time (60 hours) and no decrease was detected. Exposures longer than 40 sec resulted in partial erasure of hologram due to over-exposure. After recording the holograms the films diffracted white light and a number of colors could be seen by naked eye, indicating that refractive index grating of high strength has been stored in the depth of the recording material. A typical hologram in this material exhibits first-order diffraction efficiency of 58% (FIG. 2). This high diffraction efficiency leads to the high data storage capacity of the system. Each hologram posses an angular bandwidth of 0.30° (full-width measured at half maximum) determined at 632.8 nm. This narrow bandwidth of the angular selectivity curve imparts high resolution to the recording medium and signifies high quality of the storage material. The presence of well-defined nulls indicates that refractive index grating is stored throughout the depth of the recording medium (FIG. 2).

Figure 3:
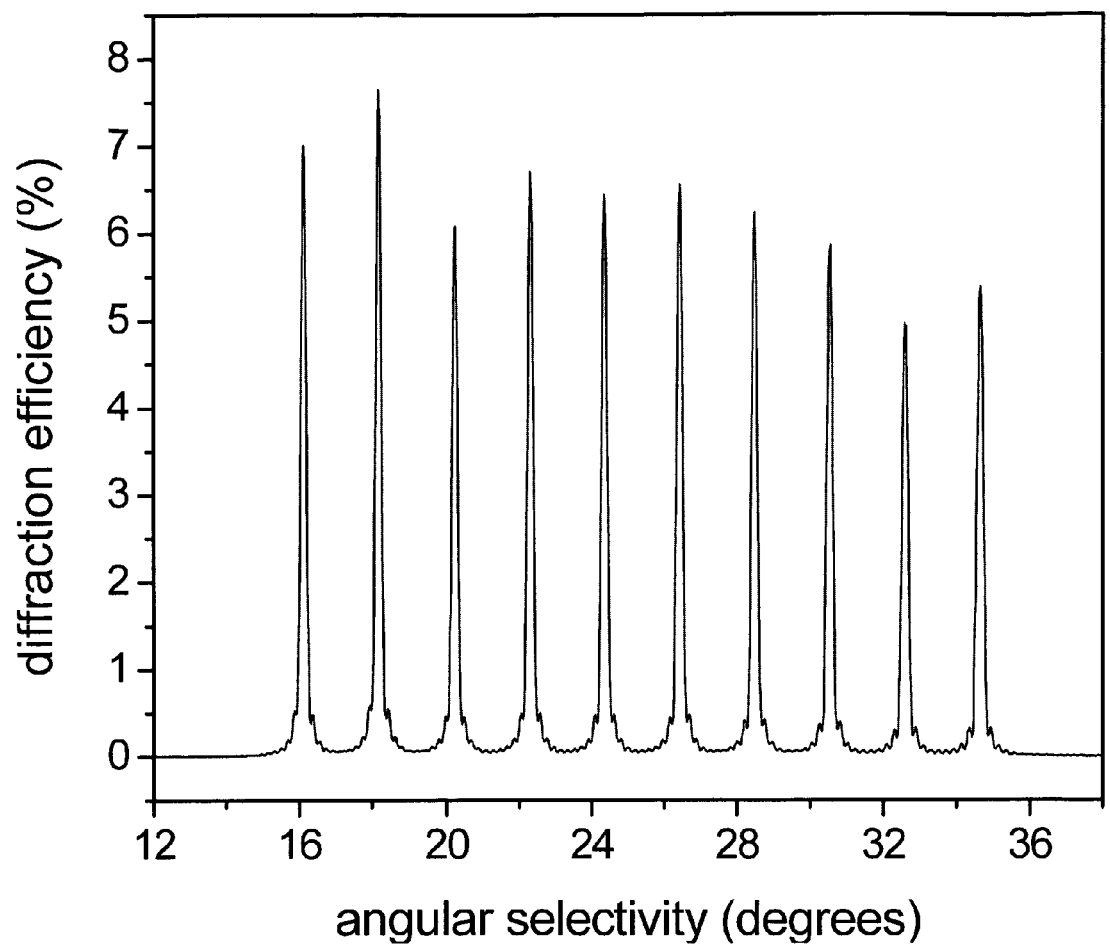
FIG. 3 shows Angular multiplexing. 10 holograms were recorded in 0.5 mm thick film. The exposure time for recording of each hologram was 6 seconds. The gratings were recorded at different angles while the angle between the recording beams was kept constant. The diffraction efficiency as a function of rotation angle was measured subsequently using laser at 632.8 nm. The angular step was 2 degree. Note that the dynamic range has not completely leveled off at the end of exposure.

The 0.5 millimeter thick film of the recording media allowed angular multiplexing of many holograms at the same spatial position. FIG. 3 shows 10 angularly multiplexed holograms of roughly equal strength recorded by rotating the sample in 2° increments. The recording time for each hologram was 6 sec. The performance value that characterizes the capacity of these materials, the dynamic range (M/#), can be calculated from these data by summing the square root of the diffraction efficiency of each hologram. The M/# determined for this material was 2.5. The sharp, highly symmetrical, and narrow bandwidth of the angular selectivity curves indicates the high resolution that can be achieved by this dewar benzene isomerization system.

The method for fabrication of holographic discs presented here involves very simple and efficient processing and the resulting material exhibit excellent information storage properties. These results offer a significant advance in the field of three dimensional data storage and the material hold promise for commercially viable write-once-read-many kind of holographic memories.

EXAMPLE

Formulation. Formulations were prepared by mixing 200 mg dewarbenzene monomer 1, 3.5 mg AIBN, 50 mg divinylbenzene, and 3.5 mg Isopropyl-9H-thioxanthen-9-one. The mixture was placed in an oil bath (90° C.) for few seconds till a clear solution was obtained. Note: Special care should be taken to avoid any moisture and light.

Sample Preparation. To fabricate optical films, several drops of the clear formulation were placed in between two 3×1 inch glass plates separated by Teflon spacers of the desired thicknesses (0.5-1.5 mm). Plastic clips were placed on both ends of the glass slides to hold them in proper position. The whole assembly was then placed in a heating oven set at 95° C. Curing time of 25 minutes was required for obtaining good optical quality films of 0.5 mm thickness. After curing the films, the sample sandwiched between two glass slides was mounted on the holographic setup and exposed.

Properties of the Holographic System:

| | |
|---|---|
| Total fabrication time | 40 minutes |
| thickness | 0.5 mm |
| Sensitivity | 77 m/J |
| Total exposure time | 40 sec |
| Diffraction efficiency | 58% |
| Scattering | No scattering |
| Δn | $3 \times 10^{-4}$ |

REFERENCES

1. U.S. Pat. No. 6,569,600 B2, Dinncenzo et al.
2. U.S. Pat. No. 7,022,392 B2, Dinncenzo et al.
3. U.S. Pat. No. 6,969,578 Robello et al.
4. U.S. Patent Application No. 2203/0072250 A1, Dinncenzo et al.
5. US Patent Application No. 2005/0095390 A1, Dinncenzo et al.
6. US Patent Application No. 2005/0136357 A1, Farid et al.
7. Evans, T. R., Wake, R. W. & Sifain, M. M. Singlet Quenching Mechanisms III (1). Sensitized Isomerization of Hexamethylbicyclo [2.2.0]Hexa-2,5-Diene. A Chain Reaction. Tett left. 9, 701-704 (1973).
8. Merkel, P. B., Roh, Y., Dinnocenzo, P. J., Robello, D. R. & Farid. S. Highly Efficient Triplet Chain Isomerization of Dewar Benzenes: Adiabatic Rate Constants from Cage Kinetics. J. Phys. Chem. A. 111, 1188-199 (2007).
9. Gillmore, J. G. et al. Quantum Amplified Isomerization: A New Concept for Polymeric Optical Materials. Macromolecules. 38, 7684-7694 (2005).
10. Robello, D. R., Farid. S. Y., Dinnocenzo, P. J. & Brown, T. G. Refractive index imaging via a chemically amplified process in a solid polymeric medium. Proc. of SPIE. 61117, 611170F1-611170F8 (2006).

The invention claimed is:
1. A composition used to prepare an optical recording material comprising:
  a dewar benzene monomer, with at least two cross-linkable groups, capable of undergoing isomerization thereby causing a change in optical properties; and a sensitizer, capable of transferring electrons to and/or receiving electrons from said dewar benzene reactant, wherein said composition is used to prepare an optical recording material.

2. The composition of claim 1, with at least one cross-linker, capable of cross-linking with said dewar benzene reactant.

3. The composition of claim 1 or 2, with an initiator.

4. The composition of claim 1, without a binder.

5. The composition of claim 1, wherein the dewar benzene monomer has the formula of:

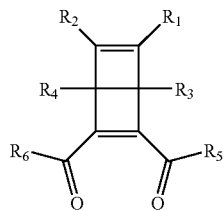

wherein $R_1$, $R_2$, $R_3$, and $R_4$ can be substituted or unsubstituted alkyl, alkoxy or phenyl groups, while $R_5$ and $R_6$ are crosslinkable groups selected from the group consisting of acrylate, methacrylate, vinyl benzene, vinyl ether, N-vinyl, alkyl thiol and alkoxy thiol.

6. The composition of claim 1, wherein the dewar benzene monomer is selected from the group consisting of bis(2-(acryloyloxy)ethyl) 1,4,5,6-tetramethylbicyclo[2.2.0]hexa-2,5-diene-2,3-dicarboxylate; bis(4-methyl-3-oxopent-4-enyl) 1,4,5,6-tetramethylbicyclo[2.2.0]hexa-2,5-diene-2,3-dicarboxylate; 4-methyl-3-oxopent-4-enyl 1,4,5,6-tetramethyl-3-(4-methyl-3-oxopent-4-enylcarbamoyl) bicyclo[2.2.0]hexa-2,5-diene-2-carboxylate; 1,4,5,6-tetramethyl-N2,N3-bis(4-methyl-3-oxopent-4-enyl)bicyclo[2.2.0]hexa-2,5-diene-2,3-dicarboxamide; 1,4,5,6-tetramethyl-N2,N3-bis(3-oxopent-4-enyl)bicyclo[2.2.0]hexa-2,5-diene-2,3-dicarboxamide; N2,N3-diacryloyl-1,4,5,6-tetramethylbicyclo[2.2.0]hexa-2,5-diene-2,3-dicarboxamide; N2,N3-dimethacryloyl-1,4,5,6-tetramethylbicyclo[2.2.0]hexa-2,5-diene-2,3-dicarboxamide; and bis(1-(acryloyloxy)-3-phenoxypropan-2-yl) 1,4,5,6-tetramethylbicyclo[2.2.0]hexa-2,5-diene-2,3-dicarboxylate.

7. The composition of claim 1, wherein the sensitizer is selected from the group consisting of isopropyl-9H-thioxanthen-9-one; thioxanthone; 2-(trifluoromethyl)-9H-thioxanthen-9-one; 2-isopropylthioxanthone; 2-methylthiaxanthone; 3-methoxy-4-(dimethylaminomethyl)thioxanthone hydrochloride; 3-methoxy-4-(diethylaminomethyl)thioxanthone hydrochloride; 3-methoxy-4-piperidinomethylthioxanthone hydrochloride; 3-methoxy-4-morpholinomethylthioxanthone hydrochloride; 3-hydroxy-4-(dimethylaminomethyl)-9-thioxanthenone hydrochloride; 3-hydroxy-4-(diethylaminomethyl)-9-thioxanthenone hydrochloride; 3-hydroxy-4-piperidinomethyl-9-thioxanthenone hydrochloride;2-(2-(dimethylamino)ethoxy)thioxanthen-9-one hydrochloride; 2-(3-dimethylaminopropoxy) thioxanthone hydrochloride monohydrate; 2-(2-(diethylamino)ethoxy)thioxanthen-9-one hydrochloride; 4-(beta-diethylaminoethylamino)-1,2-cyclohexenothiaxanthone; 3-carboxythioxanthone-10,10-dioxide; 7-methylthioxanthone-2-carboxylic acid; 4-(bis(2'-chloroethyl)amino) propylamino-1,2-cyclohexenothioxanthone; 4-isopropyl-9-thioxanthone; 4-(3-(methylamino)propoxy)-9H-thioxanthen-9-one hydrochloride; and 4-(4-(methylamino) butoxy)-9H-thioxanthen-9-one hydrochloride.

8. The composition of claim 1, wherein the cross-linker is selected from the group consisting of divinylbenzene: 1,3-butanediol diacrylate; 1,4-butanediol diacrylate; 1,6-hexanediol diacrylate; ethylene glycol diacrylate; glycerol 1,3-diglycerolate diacrylate; pentaerythritol diacrylate monostearate; 1,6-hexanediol ethoxylate diacrylate; 1,6-hexanediol propoxylate diacrylate; bisphenol A ethoxylate diacrylate; bisphenol A propoxylate diacrylate; di(ethylene glycol) diacrylate; poly(ethylene glycol) diacrylate; poly(propylene glycol) diacrylate; and tetra(ethylene glycol) diacrylate.

9. The composition of claim 1, wherein the initiator is selected from the group consisting of azobisisobutyronitrile; azobis(cyclohexanecarbonitrile) and benzoyl peroxide.

10. An optical recording material resulting from the curing of the composition of claim 1, which has a diffraction efficiency of about 60% with an exposure time of less than 40 seconds.

11. An optical recording material resulting from the curing of the composition of claim 1, which has a dynamic range of about 2.5.

12. The optical recording material of claim 11, wherein the devise material is capable of recording an optical image in the absence of a binder.

13. The optical recording material product formed by curing the composition of claim 1.

14. An optical recording device comprising an optical recording material resulting from the curing of a composition comprising a dewar benzene monomer, with at least two cross-linkable groups, capable of undergoing isomerization thereby causing a change in optical properties; and a sensitizer, capable of transferring electrons to and/or receiving electrons from said dewar benzene reactant, wherein said composition is used to prepare an optical recording material.

15. The optical recording device of claim 14, wherein the composition further comprises an initiator.

16. A method of fabricating an optical film comprising:
mixing a dewar benzene monomer, with a sensitizer, and a crosslinker to form a composition, and
curing and cross-linking of said composition;
wherein the dewar benzene monomer comprises at least two cross-linkable groups capable of undergoing isomerization thereby causing a change in optical properties.

17. The method of claim 16, w wherein the curing process is carried out at about 80-100° C. for about 35-45 minutes.

18. The method of claim 16, wherein the time taken for fabrication of the film is about 35-45 minutes.

19. The method of claim 16, wherein the mixing and curing steps occur in the absence of solvents.

20. The method of claim 16 conducted in the absence of a binder or binder forming material.

21. The product formed by the method of claim 16.

22. The product of claim 21, wherein the product does not require a binder.

23. The method of claim 16, wherein the composition is cross-linked by assisted free radical polymerization.

* * * * *